United States Patent
Ryu

(10) Patent No.: US 10,908,716 B2
(45) Date of Patent: Feb. 2, 2021

(54) FLEXIBLE DISPLAY APPARATUS

(71) Applicant: Samsung Display Co., Ltd., Yongin-si (KR)

(72) Inventor: Jonggil Ryu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/632,693

(22) Filed: Jun. 26, 2017

(65) Prior Publication Data

US 2018/0011576 A1     Jan. 11, 2018

(30) Foreign Application Priority Data

Jul. 6, 2016  (KR) .................. 10-2016-0085598

(51) Int. Cl.
| | |
|---|---|
| *G06F 3/041* | (2006.01) |
| *G06F 1/16* | (2006.01) |
| *H01L 51/52* | (2006.01) |
| *G09F 9/30* | (2006.01) |
| *H01L 51/00* | (2006.01) |
| *H01L 51/56* | (2006.01) |

(52) U.S. Cl.
CPC .......... *G06F 3/0412* (2013.01); *G06F 1/1626* (2013.01); *G06F 1/1637* (2013.01); *G06F 1/1643* (2013.01); *G06F 1/1652* (2013.01); *G06F 3/041* (2013.01); *G09F 9/301* (2013.01); *H01L 51/0097* (2013.01); *H01L 51/5253* (2013.01); *H01L 51/56* (2013.01); *G06F 2203/04102* (2013.01); *G06F 2203/04103* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 8,237,165 B2 | 8/2012 | Kim et al. | |
| 8,957,505 B2 | 2/2015 | Wang et al. | |
| 10,248,163 B2 | 4/2019 | Luan et al. | |
| 10,345,968 B2 | 7/2019 | Kim et al. | |
| 10,727,442 B2 | 7/2020 | Wang et al. | |
| 2013/0251985 A1* | 9/2013 | Nakanishi | B32B 27/08 428/339 |

(Continued)

FOREIGN PATENT DOCUMENTS

| | | |
|---|---|---|
| CN | 102262845 A | 11/2011 |
| CN | 102969251 A | 3/2013 |

(Continued)

OTHER PUBLICATIONS

Chinese Intellectual Property Office Action for corresponding Chinese Patent Application No. 201710541690.5, dated Sep. 3, 2020, 9 pages.

*Primary Examiner* — Ifedayo B Iluyomade
(74) *Attorney, Agent, or Firm* — Lewis Roca Rothgerber Christie LLP

(57) ABSTRACT

A flexible display apparatus includes: a flexible panel having a first area, a bending area extending from the first area, and a second area extending from the bending area; a plurality of separate protection films on a surface of the flexible panel; and a filler in a gap between the plurality of separate protection films.

17 Claims, 6 Drawing Sheets

(56) References Cited

U.S. PATENT DOCUMENTS

| | | | |
|---|---|---|---|
| 2014/0217382 A1 | 8/2014 | Kwon et al. | |
| 2014/0306941 A1 | 10/2014 | Kim et al. | |
| 2015/0062460 A1* | 3/2015 | Yamada | B29C 70/763 |
| | | | 349/12 |
| 2016/0073528 A1* | 3/2016 | Park | H01L 51/529 |
| | | | 361/752 |
| 2016/0275830 A1* | 9/2016 | You | G02F 1/133305 |
| 2017/0270835 A1 | 9/2017 | Yang | |
| 2017/0367182 A1* | 12/2017 | Wu | B32B 27/32 |

FOREIGN PATENT DOCUMENTS

| | | | | |
|---|---|---|---|---|
| CN | 104680939 A | 6/2015 | | |
| CN | 105280836 A | 1/2016 | | |
| CN | 105320382 A | 2/2016 | | |
| CN | 105321895 A | 2/2016 | | |
| CN | 105518768 A | 4/2016 | | |
| CN | 105576000 A | 5/2016 | | |
| CN | 105629594 A | 6/2016 | | |
| KR | 10-2010-0130898 A | 12/2010 | | |
| KR | 10-2014-0099174 A | 8/2014 | | |
| KR | 10-2014-0122960 A | 10/2014 | | |
| KR | 10-2015-0000756 A | 1/2015 | | |
| KR | 10-2015-0079285 A | 7/2015 | | |
| WO | WO 2014/119972 A1 | 8/2014 | | |
| WO | PCT IB2015059448 | * 12/2015 | | H05K 1/03 |

* cited by examiner

FLEXIBLE DISPLAY APPARATUS

CROSS-REFERENCE TO RELATED APPLICATION

This application claims priority to and the benefit of Korean Patent Application No. 10-2016-0085598, filed on Jul. 6, 2016 in the Korean Intellectual Property Office, the disclosure of which is incorporated herein in its entirety by reference.

BACKGROUND

1. Field

Aspects of embodiments of the present invention relate to flexible display apparatuses.

2. Description of the Related Art

In general, display apparatuses may be used in mobile apparatuses, such as smart phones, laptop computers, digital cameras, camcorders, portable information terminals, notebook computers, and tablet personal computers (PCs), or in electronic apparatuses, such as desktop computers, televisions, outdoor billboards, exhibition display apparatuses, dashboards, and head-up displays (HUDs).

Recently, slimmer display apparatuses have been released.

Flexible display apparatuses are easy to carry, may have various shapes, and may be based on various suitable types of displays. Among the various types of displays, a flexible display apparatus based on organic light-emitting display (or organic light-emitting diode display) technology has been spotlighted as a popular type of flexible display apparatus.

The flexible display apparatus may be bent in one direction. However, a bending area of a flexible panel may be vulnerable to damage.

SUMMARY

Embodiments of the present invention include a flexible display apparatus that may be easily bent.

Additional aspects and features of the present invention will be set forth, in part, in the description which follows and, in part, will be apparent from the description or may be learned by practice of the presented embodiments.

According to an embodiment, a flexible display apparatus includes: a flexible panel having a first area, a bending area extending from the first area, and a second area extending from the bending area; a plurality of separate protection films on a surface of the flexible panel; and a filler in a gap between the plurality of separate protection films.

The gap between the plurality of protection films may correspond to the bending area, and the filler may be in the bending area.

The plurality of separate protection films may include a first protection film and a second protection film. The first protection film may be in the first area, and the second protection film may be in the second area. The filler may be in the bending area and may extend between the first area and the second area.

The flexible panel may have a first surface and a second surface opposite to the first surface. The first protection film and the second protection film may be on one of the first surface and the second surface and may be spaced from each other.

The flexible panel may include: a flexible substrate on which a thin film transistor and an organic light-emitting diode are arranged; and a thin film encapsulation layer over the flexible substrate. The thin film encapsulation layer may be the first surface of the flexible panel.

The flexible display apparatus may further include a functional film on the first surface of the flexible panel. The first protection film and the second protection film may be under the second surface of the flexible panel, and the bending area may be bent from the first surface toward the second surface.

The first area may extend in a first direction, the second area may extend in a second direction, and the first direction and the second direction may be different from each other.

The filler may fill a space between one area of the second surface of the flexible panel corresponding to an inner surface of the bent flexible panel, one edge of the first protection film facing the first direction, and one edge of the second protection film facing the second direction.

The first area may include a display area for displaying an image, the bending area may include an auxiliary display area or a circuit area electrically connected to the display area, and the second area may include an edge area.

The first area may extend in a first direction. The second area may be bent from the bending area and may at least partially overlap the first area.

The first protection film in the first area and the second protection film in the second area may face each other.

A surface of the first protection film and a surface of the second protection film may contact each other.

The filler may fill a space between one area of the second surface of the flexible panel corresponding to an inner surface of the bent flexible panel and one edge of the first protection film and one edge the second protection film that are adjacent each other.

The first area may include a display area for displaying an image, and the second area may include a pad area where a pad terminal is arranged.

The flexible display apparatus may further include a cover film on the filler. The first protection film and the second protection film may be on the first surface of the flexible panel. The bending area may be bent from the first surface toward the second surface, and the first surface may be an outer surface of the bent flexible panel. The filler may be on the first surface of the bent flexible panel.

The cover film may cover at least a portion of the first protection film, at least a portion of the second protection film, and the filler between the first protection film and the second protection film.

The flexible panel may be an out-foldable panel.

The first area may include a first display area for displaying an image, the second area may include a second display area for displaying an image, and the bending area may include an auxiliary display area or a circuit area electrically connected to at least one of the first area and the second area.

The flexible display apparatus may further include a reinforcement film on the second surface of the flexible panel, and the second surface may be an inner surface of the flexible panel.

The filler may include an optically clear resin.

BRIEF DESCRIPTION OF THE DRAWINGS

These and/or other aspects will become apparent and more readily appreciated from the following description of exemplary embodiments, taken in conjunction with the accompanying drawings, in which.

DETAILED DESCRIPTION

Figure 1:
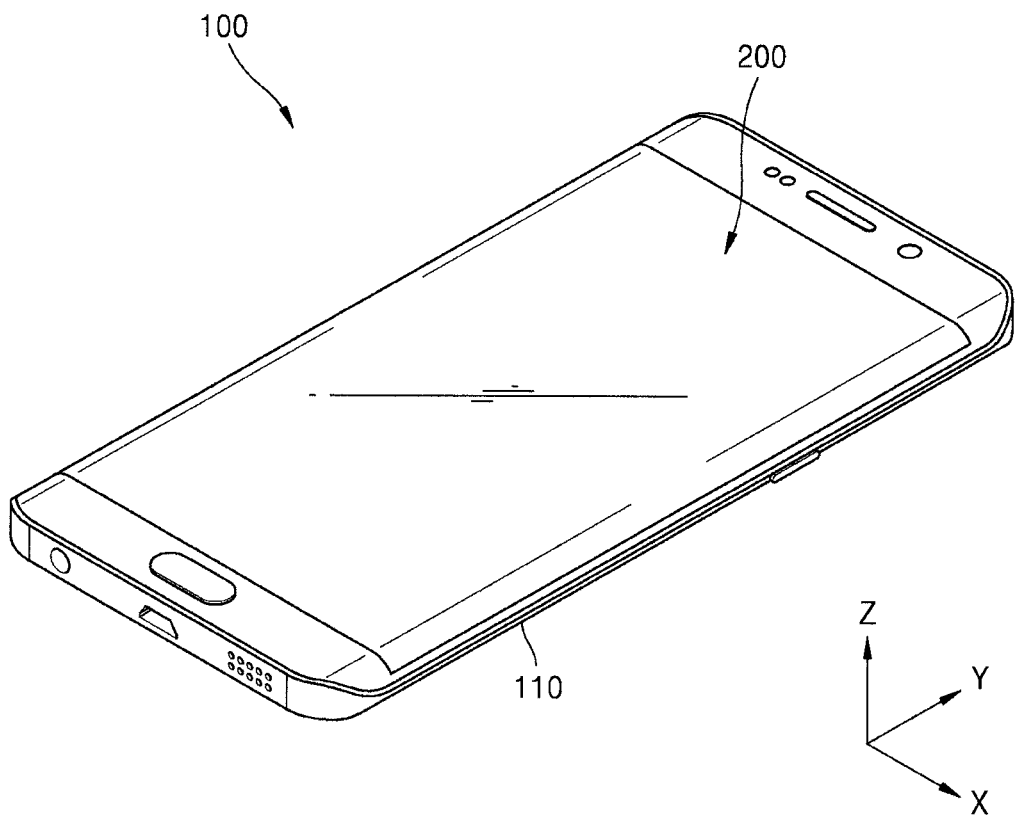
FIG. 1 is a perspective view of a flexible display apparatus according to an embodiment.

Reference will now be made, in detail, to embodiments, examples of which are illustrated in the accompanying drawings. The presented embodiments may have different forms and should not be construed as being limited to the descriptions set forth herein. Accordingly, exemplary embodiments are merely described below, by referring to the figures, to explain aspects and features of the present invention.

As used herein, the term "and/or" includes any and all combinations of one or more of the associated listed items. Expressions, such as "at least one of," when preceding a list of elements, modify the entire list of elements and do not modify the individual elements of the list. Further, the use of "may" when describing embodiments of the present invention relates to "one or more embodiments of the present invention." Also, the term "exemplary" is intended to refer to an example or illustration. As used herein, the terms "use," "using," and "used" may be considered synonymous with the terms "utilize," "utilizing," and "utilized," respectively.

The inventive concept may include various embodiments and modifications, and certain exemplary embodiments thereof are illustrated in the drawings and will be described herein in detail. The aspects and features of the inventive concept and accomplishing methods thereof will become apparent from the following description of the exemplary embodiments, taken in conjunction with the accompanying drawings. However, the inventive concept is not limited to the embodiments described below and may be embodied in various forms or modes.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

It will be understood that when a component, such as a layer, a film, a region, or a plate, is referred to as being "on" or "formed on" another component, it may be directly or indirectly on or formed on the other component. For example, intervening components may be present. Also, sizes of components in the drawings may be exaggerated for convenience of description. And, because sizes and thicknesses of components in the drawings may be arbitrarily illustrated for convenience of description, the following embodiments are not limited thereto.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

In the following embodiments, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

The driver unit (e.g., the driver) and/or any other relevant devices or components according to embodiments of the present invention described herein may be implemented utilizing any suitable hardware, firmware (e.g., an application-specific integrated circuit), software, and/or a suitable combination of software, firmware, and hardware. For example, the various components of the driver unit may be formed on one integrated circuit (IC) chip or on separate IC chips. Further, the various components of the driver unit may be implemented on a flexible printed circuit film, a tape carrier package (TCP), a printed circuit board (PCB), or formed on a same substrate as the driver unit. Further, the various components of the driver unit may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present invention.

Hereinafter, exemplary embodiments of a flexible display apparatus according to the inventive concept will be described, in detail, with reference to the accompanying drawings. In the following description, like reference numerals will be used to denote like elements, and redundant descriptions thereof may be omitted for conciseness.

Figure 2A:
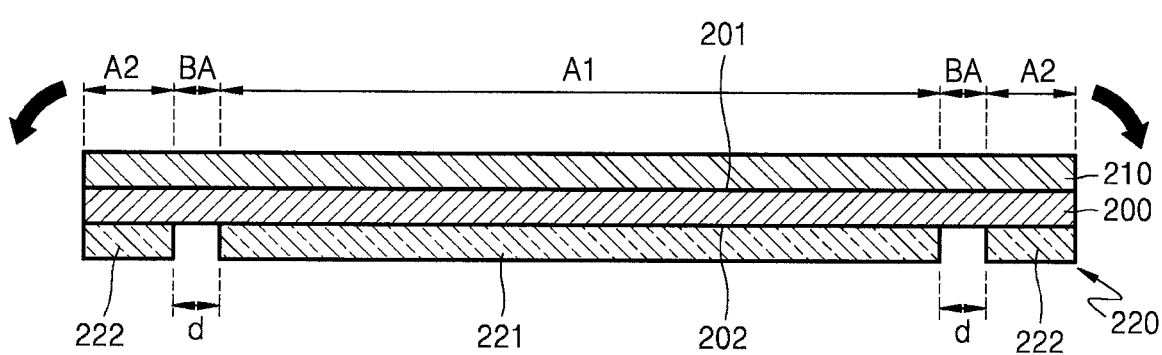
FIG. 2A is a cross-sectional view of the flexible panel shown in FIG. 1 in an unbent state.
Figure 2B:
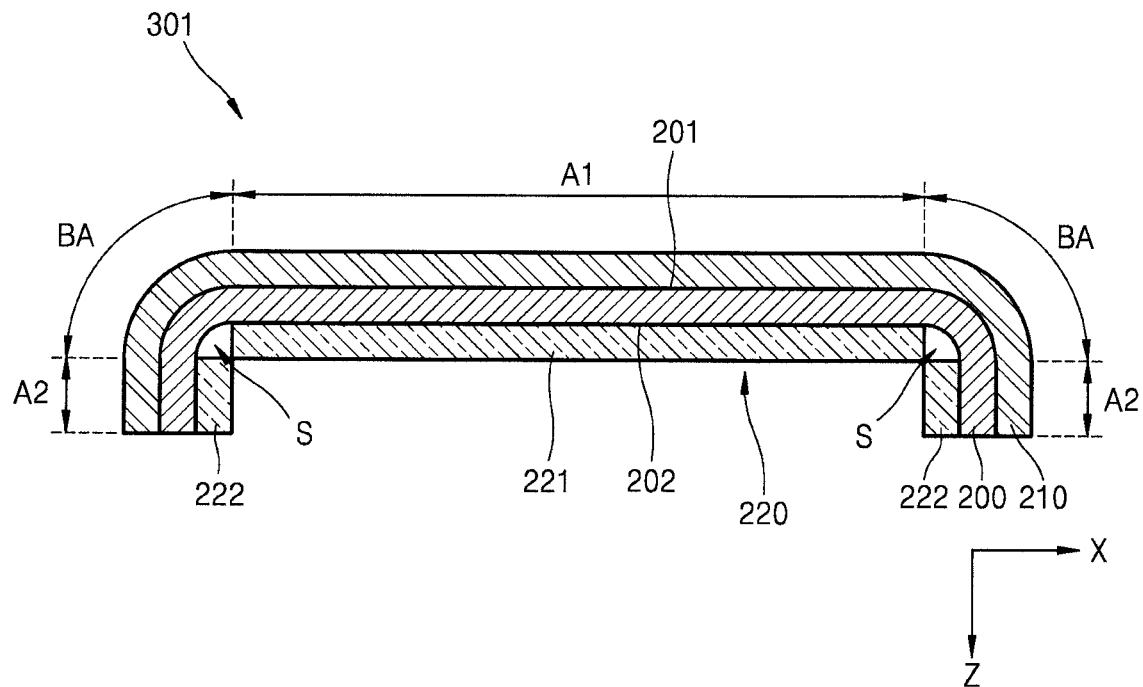
FIG. 2B is a cross-sectional view of the flexible panel shown in FIG. 2A in a bent state.
Figure 3:
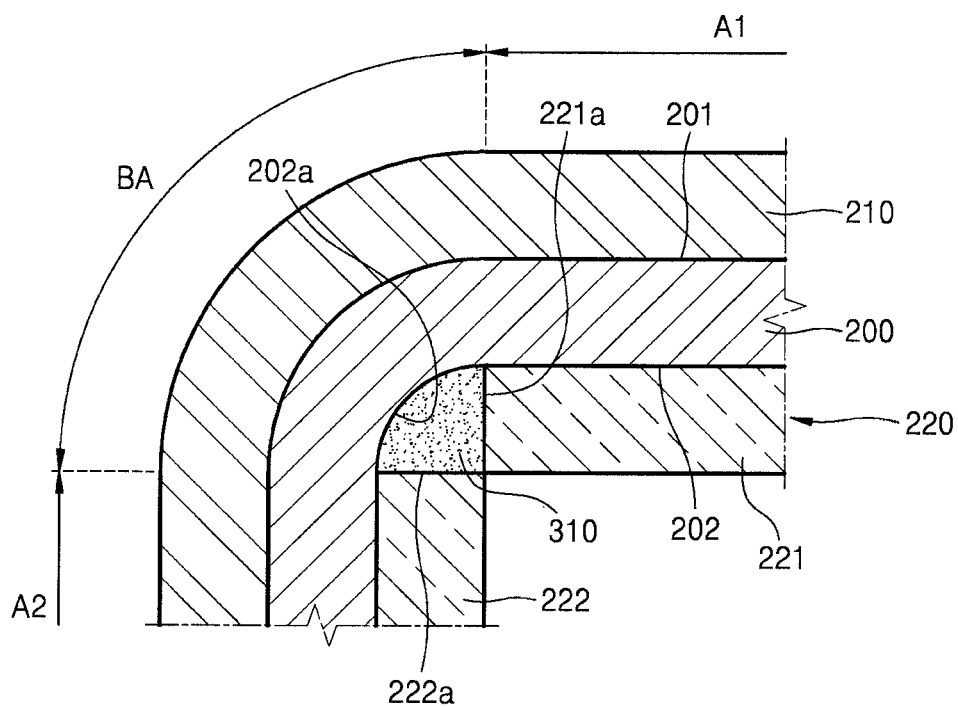
FIG. 3 is an enlarged cross-sectional view of an arrangement of a filler in a bending area of the flexible panel shown in FIG. 2B.

FIG. 1 is a perspective view of a flexible display apparatus 100 according to an embodiment. FIG. 2A is a cross-sectional view of a flexible panel 200 shown in FIG. 1 in an unbent state, and FIG. 2B is a cross-sectional view of the flexible panel 200 shown in FIG. 2A in a bent state. FIG. 3 is an enlarged cross-sectional view of an arrangement of a filler 310 in a bending area BA of the flexible panel 200 shown in FIG. 2B.

Referring to FIGS. 1-3, the flexible display apparatus 100 may include the flexible panel 200 and a housing 110 accommodating the flexible panel 200.

The flexible panel 200 may include an organic light-emitting display panel. At least one area of the flexible panel 200 may be bent (e.g., the flexible panel 200 may be bent at one or more predefined bending areas).

The flexible panel 200 may include a first area A1, a bending area BA extending from (e.g., adjacent to) the first area A1, and a second area A2 extending from (e.g., adjacent to) the bending area BA. In some embodiments, the bending area BA may be arranged on both sides (e.g., opposite sides) of the first area A1, and the second area A2 may be arranged outside the bending area BA. However, the inventive concept is not limited thereto, and the bending area BA may be variously arranged between the first area A1 and the second area A2.

Both edges (e.g., opposite edges) of the flexible panel 200 may be bent along an X direction. The first area A1 may include a display area for displaying an image. A plurality of bending areas BA may include a circuit area electrically connected to the first area A1. In other embodiments, the bending area(s) BA may include an auxiliary display area. The second area A2 may include an edge area (e.g., may be at an edge area) at where a plurality of flexible panels 200 are cut (or separated) into unit flexible panels 200 during the manufacturing process.

The flexible panel 200 may have a first surface 201 and a second surface 202 opposite to the first surface 201.

A functional film 210 may be arranged on the first surface 201 of the flexible panel 200. The functional film 210 may include various suitable films, such as a touch sensing unit (e.g., a touch panel), a polarization film, and/or a cover window.

A protection film unit 220 (e.g., a protection film) may be arranged under the second surface 202 of the flexible panel 200. The protection film unit 220 may include a plurality of protection films 221 and 222 that are arranged separately (e.g., the protection film unit 220 may include a plurality of separate protection films 221 and 222). In an embodiment, the protection film unit 220 may include a first protection film 221 and a second protection film 222. The first protection film 221 and the second protection film 222 may be arranged under the second surface 202 of the flexible panel 200 and spaced from (e.g., spaced apart from) each other.

The first protection film 221 may be arranged in the first area A1, and the second protection film 222 may be arranged in the second area A2.

Because the first protection film 221 and the second protection film 222 are arranged separately, a gap d may exist between the first protection film 221 and the second protection film 222. The gap d between the first protection film 221 and the second protection film 222 may correspond to the bending area BA. In an embodiment, both edges of the flexible panel 200 may be bent along a first direction (e.g., the X direction or a horizontal direction). Both edges of the flexible panel 200 may be bent in a second direction (e.g., a Z direction or a vertical direction). The bending area BA may be bent from the first surface 201 of the flexible panel 200 toward the second surface 202 of the flexible panel 200.

After being bent, the first area A1 may be arranged in (e.g., may extend in) the first direction (e.g., the X direction) of the flexible panel 200, and the second area A2 may be arranged in (e.g., may extend in) the second direction (e.g., the Z direction) of the flexible panel 200. The first direction and the second direction may be different from each other. However, a bending angle between the second area A2 bent from the first area A1 is not limited to a particular bending angle.

The bending area BA may not include the first protection film 221 and the second protection film 222, which could otherwise restrict a curvature radius of the flexible panel 200 in a bent state. The curvature radius of the bending area BA may be determined, at least in part, by a thickness of the flexible panel 200. Because the bending area BA does not include the protection film unit 220 (e.g., because the protection film unit 220 is not at the bending area BA), the flexible panel 200 may be easily bent. However, because the bending area BA does not include a separate protection unit (or protection film), the flexible panel 200 may be easily damaged by an external impact in operation or during the manufacturing process.

To prevent or minimize damage to the bending area BA of the flexible panel, a filler 310 may be arranged in the gap d between the first protection film 221 and the second protection film 222. The gap d between the first protection film 221 and the second protection film 222 may correspond to the bending area BA. Accordingly, the filler 310 may be arranged in the bending area BA extending between (e.g., connecting) the first area A1 and the second area A2.

The filler 310 may fill a space S formed between one area 202a of the second surface 202 corresponding to an inside surface of the bent flexible panel 200, one edge 221a of the first protection film 221 arranged in the first direction (e.g., the X direction), and one edge 222a of the second protection film 222 arranged in the second direction (e.g., the Z direction). However, the filler 310 is not limited to a particular structure or arrangement, and the filler 310 may be variously arranged in the bending area BA.

The filler 310 may include an optically clear resin (OCR). The filler 310 may include a viscous liquid (e.g., a liquid having a relatively high viscosity). The filler 310 may have a light transmittance of about 90% or more. The filler 310 may include an ultraviolet (UV)-curable resin. In another embodiment, the filler 310 may include a thermally-ageable resin (e.g., a thermally-curable resin).

The filler 310 may be formed (or applied) by various suitable manufacturing methods.

Figure 4:
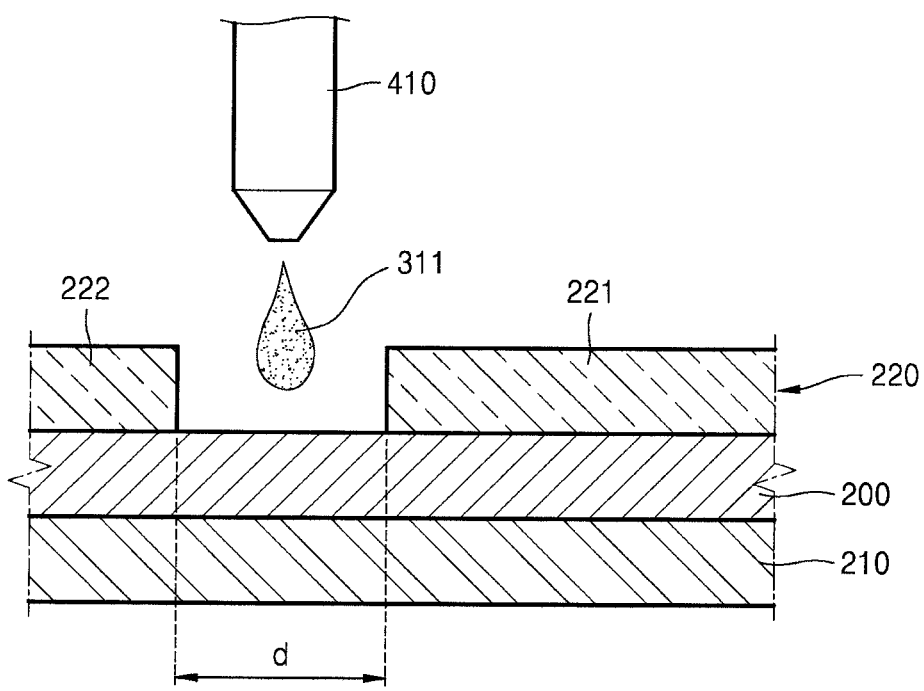
FIG. 4 is a cross-sectional view illustrating a process of applying a filler between protection films according to an embodiment.

The filler 310 may be formed by an inkjet method. For example, as illustrated in FIG. 4, a raw filler material 311 may be applied into the gap d between the first protection film 221 and the second protection film 222 through a nozzle 410 before the flexible panel 200 is bent. The flexible panel 200 may be bent after the forming of (e.g., after the application or printing of) the raw filler material 311.

Figure 5:
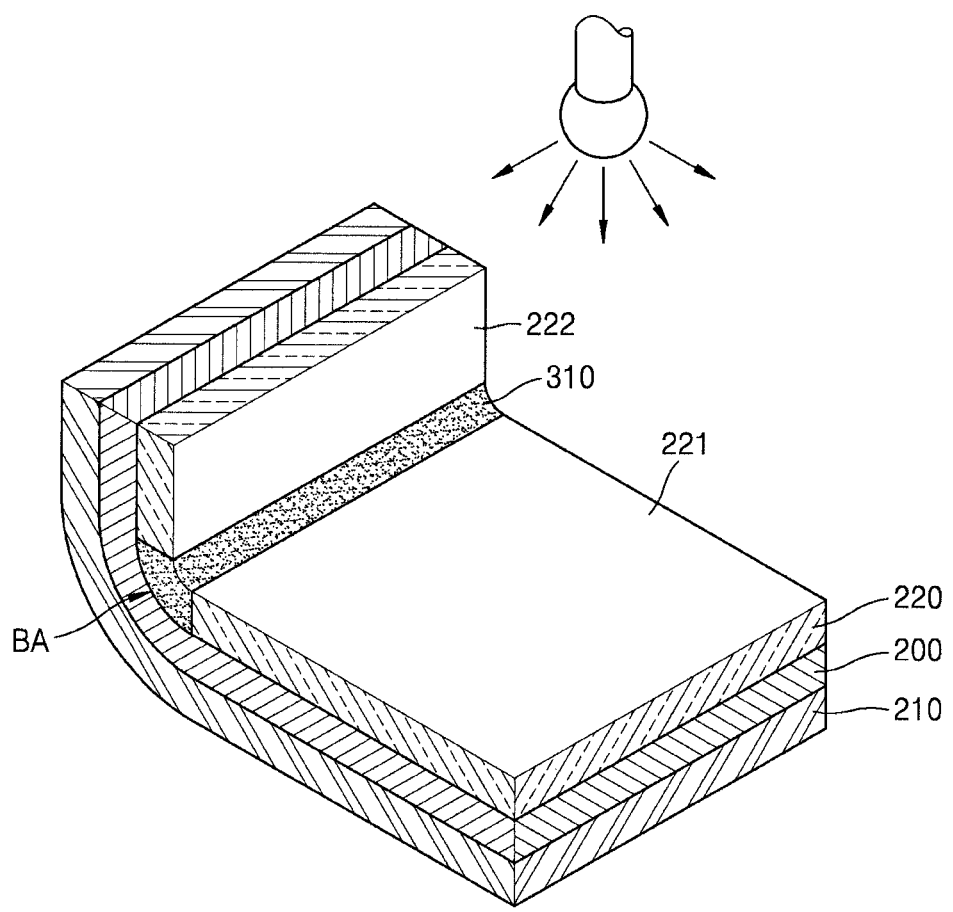
FIG. 5 is a cross-sectional view illustrating a process of curing the filler shown in FIG. 4.

Also, the filler 310 may be completed by (e.g., may be cured or hardened by) a UV-curing process. As illustrated in FIG. 5, after the flexible panel 200 is bent, ultraviolet light may be irradiated from an ultraviolet lamp onto the raw filler material 311, and the filler 310 in the bending area BA may be cured. Accordingly, the filler 310 may be bent and fixed along a curved surface of the bending area BA.

A finishing process may be performed after the forming of (e.g., after the curing or hardening of) the filler 310. For example, a portion of the filler 310 may protrude into an undesired area, for example, to an edge of the flexible panel 200 (e.g., to an edge of the flexible panel 200 in the width direction of FIG. 5). In such a case, the protruding portion of the filler 310 may be removed. In other embodiments, a taping process may be performed to prevent the filler 310 from protruding to an undesired area or a resin may be additionally applied thereon if an undesired gap in the filler 310 exists.

Figure 6:
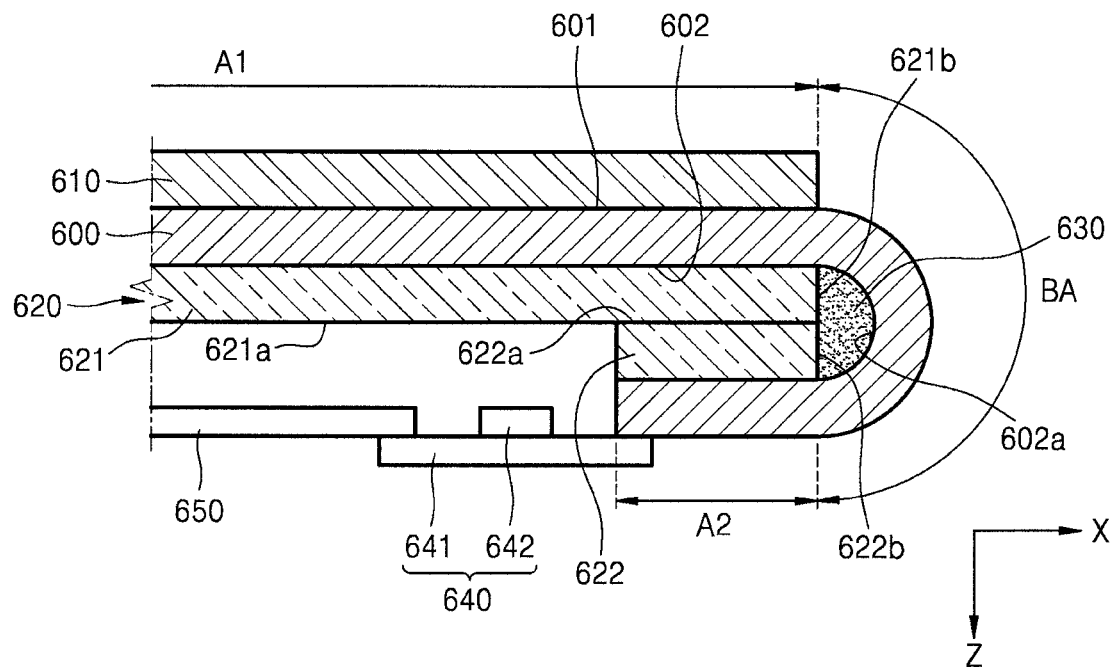
FIG. 6 is a cross-sectional view of an arrangement of a filler in a bending area of a flexible panel according to another embodiment.

FIG. 6 is a cross-sectional view of an arrangement of a filler 630 in a bending area BA of a flexible panel 600 according to another embodiment.

Referring to FIG. 6, the flexible panel 600 may include a first area A1, a bending area BA extending from the first area A1, and a second area A2 extending from the bending area BA.

The flexible panel 600 may be bent from a first direction (e.g., an X direction), that is, a horizontal direction to a second direction (e.g., a Z direction), that is, a vertical direction. The first area A1 may include a display area for displaying an image, the bending area(s) BA may include a circuit area electrically connected to the first area A1, and the second area A2 may include a pad area where a pad terminal is arranged.

The flexible panel 600 may have a first surface 601 and a second surface 602 opposite to the first surface 601.

A functional film 610 may be arranged on the first surface 601 of the flexible panel 600. The functional film 610 may include various suitable films, such as a touch sensing unit (e.g., a touch panel), a polarization film, and/or a cover window.

A protection film unit 620 (e.g., a protection film) may be arranged under the second surface 602 of the flexible panel 600. The protection film unit 620 may include a first protection film 621 and a second protection film 622. The first protection film 621 may be arranged in the first area A1, and the second protection film 622 may be arranged in the second area A2.

One edge of the flexible panel 600 may be bent. The one edge (e.g., the bent edge) of the flexible panel 600 may include an area electrically connected to an external circuit board. A driving unit 640 (e.g., a driver) may be connected to the second area A2.

The driving unit 640 may include a driving circuit and may have a chip-on-film (COF) structure. The driving unit 640 may include a flexible film 641 and a driving integrated circuit (IC) 642 arranged on the flexible film 641. A pad terminal arranged at the second area A2 and a driving terminal arranged on the flexible film 641 may be electrically connected to each other.

In an embodiment, the driving unit 640 may have a chip-on-plastic (COP) structure. In another embodiment, the driving unit 640 may have a chip-on-glass (COG) structure.

The driving unit 640 may be electrically connected to a circuit board 650. The circuit board 650 may include a flexible printed circuit board (FPCB).

The bending area BA may be bent from the first surface 601 of the flexible panel 600 toward the second surface 602 of the flexible panel 600. After being bent, the first area A1 may be arranged in (e.g., may extend in) the first direction (e.g., the X direction) of the flexible panel 600. The second area A2 may be bent from the bending area BA. The second area A2 may be arranged in (e.g., may extend in) the first direction (e.g., the X direction) of the flexible panel 600. At least a portion of the second area A2 may overlap with the first area A1 (e.g., at least a portion of the second area A2 may overlap with the first area A1 in the second direction). For example, the first protection film 621 arranged in the first area A1 and the second protection film 622 arranged in the second area A2 may face each other. In some embodiments, a surface 621a of the first protection film 621 and a surface 622a of the second protection film 622 may contact each other.

A filler 630 may be arranged in the bending area BA extending between (e.g., connecting) the first area A1 and the second area A2. The filler 630 may fill a space formed between one area 602a of the second surface 602 of the flexible panel 600 (e.g., an inside surface of the bent flexible panel 600), one edge 621b of the first protection film 621, and one edge 622b of the second protection film 622 that face each other. However, the inventive concept is not limited to a particular structure or arrangement, and the first protection film 621 and the second protection film 622 may face each other and the filler 630 may be arranged in the bending area BA according to other suitable configurations.

Figure 7:
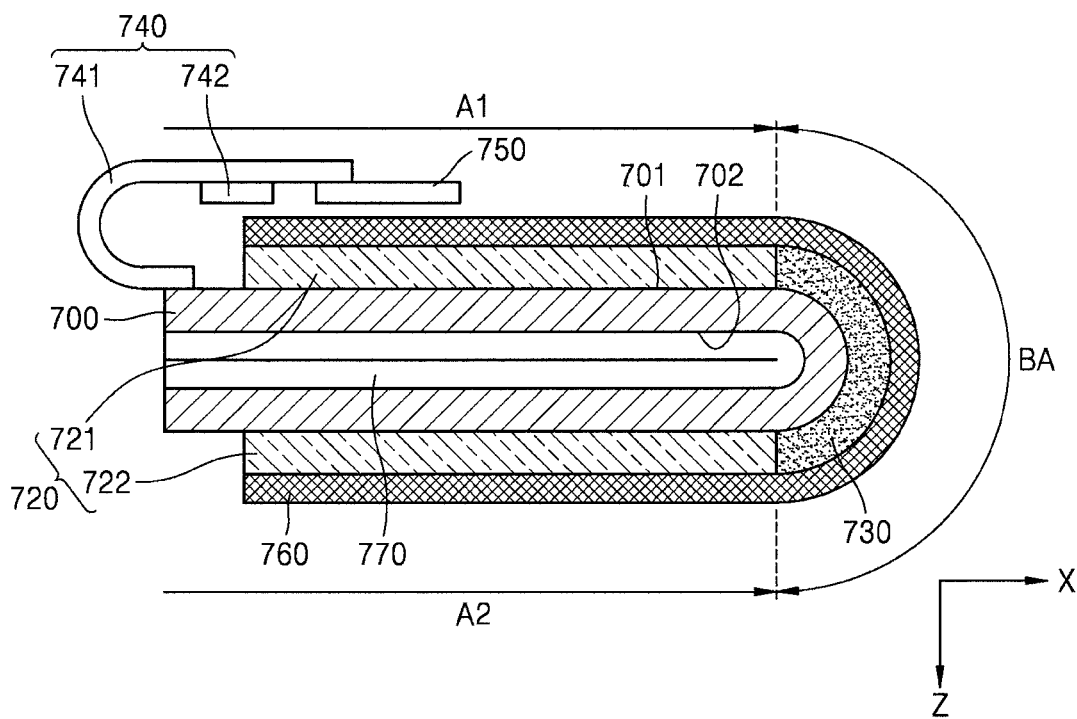
FIG. 7 is a cross-sectional view of an arrangement of a filler in a bending area of a flexible panel according to another embodiment.

FIG. 7 is a cross-sectional view of an arrangement of a filler 730 in a bending area BA of a flexible panel 700 according to another embodiment.

Referring to FIG. 7, the flexible panel 700 may include a first area A1, a bending area BA extending from the first area A1, and a second area A2 extending from the bending area BA.

The flexible panel 700 may include an out-foldable panel having a screen (e.g., a display screen) on an outer surface of the bent flexible panel 700 (e.g., the flexible panel 700 may be folded such that edges of the flexible panel 700 are folded away from a surface on which the screen is arranged). The first area A1 may include a first display area for displaying an image. The second area A2 may include a second display area for displaying an image. The bending area BA may include a circuit area electrically connected to at least one of the first area A1 and the second area A2. In another embodiment, the bending area BA may include an auxiliary display area.

When the flexible panel 700 is unfolded, a large screen may be implemented throughout the entire area (e.g., the combined areas) of the first area A1 and the second area A2. When the flexible panel 700 is folded, a small screen may be implemented in the first area A1 or the second area A2.

In an embodiment, a driving unit 740 (e.g., a driver) may be connected to one of the first area A1 and the second area A2. For example, the driving unit 740 may be connected to the first area A1. The driving unit 740 may include a flexible film 741 and a driving IC 742 arranged under the flexible film 741. A pad terminal arranged at the first area A1 and a driving terminal arranged at the flexible film 741 may be electrically connected to each other. The driving unit 740 may be electrically connected to a circuit board 750.

The flexible panel 700 may have a first surface 701 and a second surface 702 opposite to the first surface 701.

A protection film unit 720 (e.g., a protection film) may be arranged on the first surface 701 of the flexible panel 700. The protection film unit 720 may include a first protection film 721 and a second protection film 722. The first protection film 721 may be arranged in the first area A1, and the second protection film 722 may be arranged in the second area A2.

The bending area BA may be bent from the first surface 701 of the flexible panel 700 toward the second surface 702 of the flexible panel 700. In an embodiment, the flexible panel 700 may be folded in half and/or unfolded with respect to (e.g., about) the bending area BA.

After being bent, the first protection film 721 arranged in the first area A1 and the second protection film 722 arranged in the second area A2 may be arranged on opposite surfaces of the flexible panel 700. For example, the first protection film 721 may be arranged over the flexible panel 700, and the second protection film 722 may be arranged under the flexible panel 700.

A filler 730 may be arranged in the bending area BA extending between (e.g., connecting) the first area A1 and the second area A2. The filler 730 may be arranged on the first surface 701 of the bent flexible panel 700. The first surface 701 of the flexible panel 700 may correspond to an outer surface of the bent flexible panel 700.

A cover film 760 may be arranged on the filler 730. Because the flexible panel 700 is an out-foldable panel, the filler 730 may not need to be fixed in a bent state. Thus, different from the filler 310 shown in FIG. 3, the filler 730 may not be cured, and the cover film 760 may prevent separation of the filler 730.

In an embodiment, the cover film 760 may cover at least a portion of the first protection film 721, at least a portion of the second protection film 722, and the filler 730 between the first protection film 721 and the second protection film 722. However, the cover film 760 is not limited to a particular structure or arrangement and may have any suitable structure or arrangement that prevents separation of the filler 730 from the flexible panel 700.

A reinforcement film 770 may be further arranged on the second surface 702 corresponding to an inner surface of the bent flexible panel 700.

Figure 8:
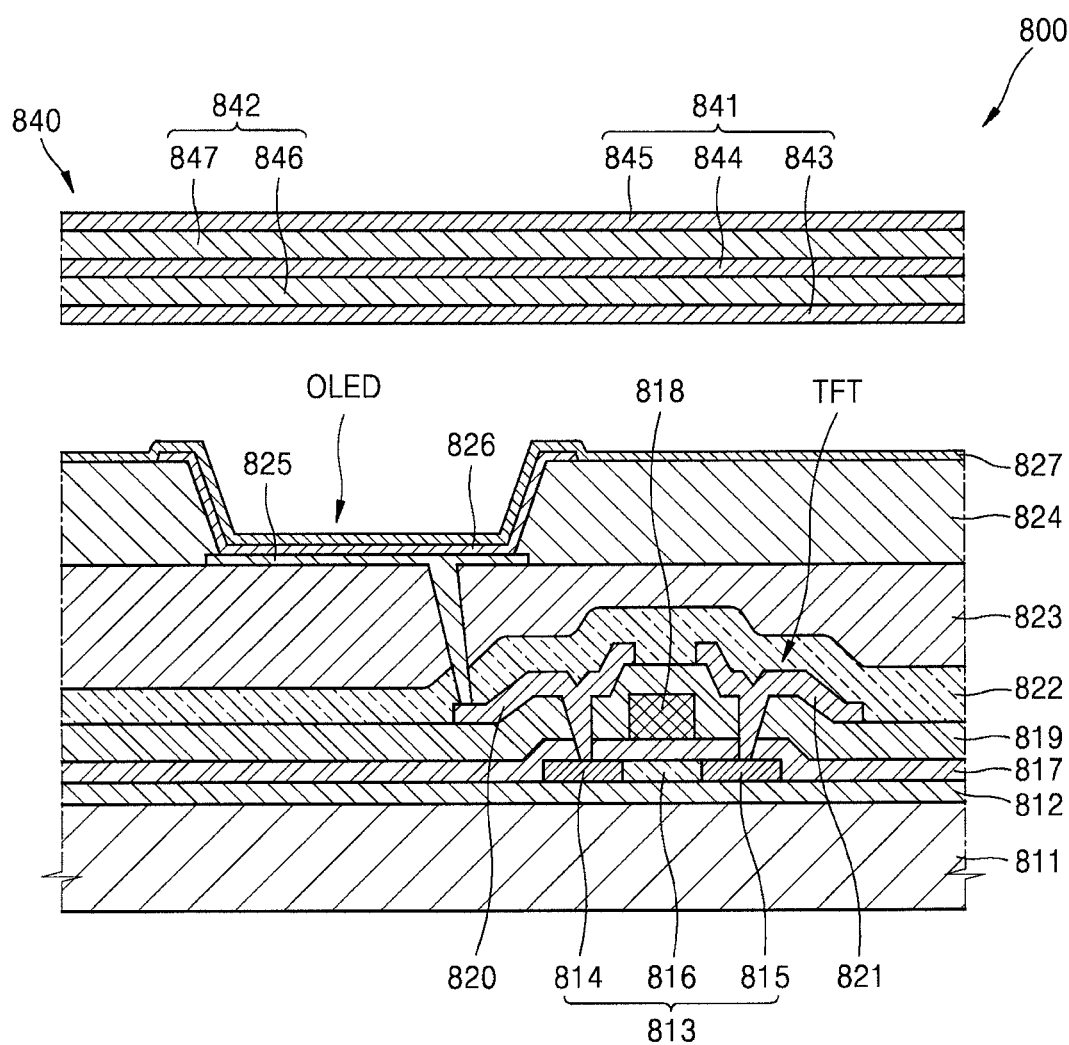
FIG. 8 is a cross-sectional view of a subpixel of an organic light-emitting display panel according to an embodiment.

FIG. 8 is a cross-sectional view of a subpixel of an organic light-emitting display panel 800 according to an embodiment.

In the present embodiment, each of the subpixels may include a thin film transistor (TFT) and an organic light-emitting diode (OLED) device. However, the subpixels are not limited to the structure shown in FIG. 8, and a number and structure of thin film transistors (TFTs) in the subpixels may vary in various suitable ways.

Referring to FIG. 8, the organic light-emitting display panel 800 may include a flexible substrate 811 and a thin film encapsulation layer 840 arranged over the flexible substrate 811. For example, the thin film encapsulation layer 840 may be located on or over the first surface 201 of the flexible panel 200 shown in FIG. 2A.

The flexible substrate 811 may include a flexible glass substrate, a flexible polymer substrate, or a flexible film. The flexible substrate 811 may be transparent, semitransparent (e.g., translucent), or opaque.

A buffer layer 812 may be arranged on the flexible substrate 811. The buffer layer 812 may entirely cover a top surface of the flexible substrate 811. The buffer layer 812 may include an inorganic material and/or an organic material. The buffer layer 812 may have a single-layer structure or a multi-layer structure.

A thin film transistor TFT may be arranged over the buffer layer 812. In the illustrated embodiment, the thin film transistor TFT is illustrated as being a top-gate transistor; however, the thin film transistor TFT may be any other suitable type of thin film transistor TFT, such as a bottom-gate transistor.

A semiconductor active layer 813 may be arranged on the buffer layer 812.

The semiconductor active layer 813 may include a source area 814 and a drain area 815 formed by doping with N-type dopant ions or P-type dopant ions. An undoped channel area 816 may be arranged between the source area 814 and the drain area 815. The semiconductor active layer 813 may include an organic semiconductor, an inorganic semiconductor, or amorphous silicon. In an embodiment, the semiconductor active layer 813 may include an oxide semiconductor.

A gate insulating layer 817 may be deposited on the semiconductor active layer 813. The gate insulating layer 817 may include an inorganic layer. The gate insulating layer 817 may have a single-layer structure or a multi-layer structure.

A gate electrode 818 may be arranged on the gate insulating layer 817. The gate electrode 818 may include a metal material having excellent conductivity. The gate electrode 818 may have a single-layer structure or a multi-layer structure.

An interlayer insulating layer 819 may be arranged on the gate electrode 818. The interlayer insulating layer 819 may include an inorganic layer or an organic layer.

A source electrode 820 and a drain electrode 821 may be arranged on the interlayer insulating layer 819. The source electrode 820 and the drain electrode 821 may be respectively electrically connected to the source area 814 and the drain area 815 through contact openings in the interlayer insulating layer 819.

A passivation layer 822 may be arranged on the source electrode 820 and the drain electrode 821. The passivation layer 822 may include an inorganic layer or an organic layer. A planarization layer 823 may be arranged on the passivation layer 822. The planarization layer 823 may include an inorganic layer or an organic layer. In some embodiments, the passivation layer 822 or the planarization layer 823 may be omitted.

The thin film transistor TFT may be electrically connected to an organic light-emitting device (OLED).

The organic light-emitting device OLED may be arranged on the planarization layer 823. The organic light-emitting device OLED may include a first electrode 825, an intermediate layer 826, and a second electrode 827.

The first electrode 825 may function as an anode and may include various suitable conductive materials. The first electrode 825 may be a transparent electrode or a reflective electrode.

A pixel definition layer 824 may be arranged on the planarization layer 823. The pixel definition layer 824 may cover a portion of (e.g., an edge or periphery of) the first electrode 825. The pixel definition layer 824 may define an emission area of each subpixel by covering an edge of the first electrode 825. The first electrode 825 may be patterned per subpixel.

The pixel definition layer 824 may include an organic layer and/or an inorganic layer. The pixel definition layer 824 may have a single-layer structure or a multi-layer structure.

An intermediate layer 826 may be arranged on the first electrode 825 at where the first electrode 825 is exposed through the pixel definition layer 824. The intermediate layer 826 may be formed by a deposition process.

The intermediate layer 826 may include an organic emission layer.

In some embodiments, the intermediate layer 826 may include an organic emission layer and may further include a hole injection layer (HIL), a hole transport layer (HTL), an electron transport layer (ETL), and/or an electron injection layer (EIL). However, the present invention is not limited thereto, and the intermediate layer 826 may include an organic emission layer and may further include various other suitable functional layers.

The second electrode 827 may be arranged on the intermediate layer 826.

The second electrode 827 may function as a cathode. The second electrode 827 may be a transparent electrode or a reflective electrode.

In an embodiment, a plurality of subpixels may be arranged on or over the flexible substrate 811. For example, a red, green, blue, or white color may be implemented in each subpixel (e.g., each subpixel may emit red, green, blue, or white color). However, the inventive concept is not limited thereto.

The thin film encapsulation layer 840 may cover the organic light-emitting diode OLED. In some embodiments, the thin film encapsulation layer 840 includes an inorganic layer 841 and an organic layer 842 that are alternately stacked. For example, the inorganic layer 841 may include a first inorganic layer 843, a second inorganic layer 844, and a third inorganic layer 845. The organic layer 842 may include a first organic layer 846 and a second organic layer 847.

According to embodiments of the inventive concept, a flexible display apparatus may be easily bent and also may be protected because a filler is arranged in a bending area.

It should be understood that the embodiments described herein should be considered in a descriptive sense only and not for purposes of limitation. Descriptions of features or aspects within each embodiment should typically be considered as available for other similar features or aspects in other embodiments.

While embodiments have been described with reference to the figures, it will be understood by those of ordinary skill in the art that various changes in form and details may be made therein without departing from the spirit and scope as defined by the following claims and their equivalents.

What is claimed is:

1. A flexible display apparatus comprising: a flexible panel having a first area extending in a first direction, a bending area extending from the first area, and a second area extending from the bending area and extending in a second direction, the first direction and the second direction crossing each other; a plurality of separate protection films on a surface of the flexible panel, a gap between the separate protection films being at the bending area of the flexible panel; and a filler in the gap at the bending area and extending entirely between the plurality of separate protection films to fill a space between one area of the flexible panel corresponding to an inner surface of the flexible panel, one edge of a first one of the protection films facing the first direction, and one edge of a second one of the protection films facing the second direction, wherein the filler directly contacts with the separate protection films and the flexible panel, wherein the first area comprises a first display area for displaying an image, the second area comprises a second display area for displaying an image, and the bending area comprises a display area for displaying an image.

2. The flexible display apparatus of claim 1, wherein the plurality of separate protection films comprises a first protection film and a second protection film,
wherein the first protection film is in the first area, and the second protection film is in the second area, and
wherein the filler is in the bending area and extends between the first area and the second area.

3. The flexible display apparatus of claim 2, wherein the flexible panel has a first surface and a second surface opposite to the first surface, and
wherein the first protection film and the second protection film are on one of the first surface and the second surface and are spaced from each other.

4. The flexible display apparatus of claim 3, wherein the flexible panel comprises:
a flexible substrate on which a thin film transistor and an organic light-emitting diode are arranged; and
a thin film encapsulation layer over the flexible substrate, and
wherein the thin film encapsulation layer is the first surface of the flexible panel.

5. The flexible display apparatus of claim 3, further comprising a functional film on the first surface of the flexible panel,
wherein the first protection film and the second protection film are under the second surface of the flexible panel, and
wherein the bending area is bent from the first surface toward the second surface.

6. The flexible display apparatus of claim 1, wherein the first area comprises a display area for displaying an image,
wherein the bending area comprises an auxiliary display area or a circuit area electrically connected to the display area, and
wherein the second area comprises an edge area.

7. The flexible display apparatus of claim 5, wherein the first area extends in a first direction, and
wherein the second area is bent from the bending area and at least partially overlaps the first area.

8. The flexible display apparatus of claim 7, wherein the first protection film in the first area and the second protection film in the second area face each other.

9. The flexible display apparatus of claim 8, wherein a surface of the first protection film and a surface of the second protection film contact each other.

10. The flexible display apparatus of claim 8, wherein the filler fills a space between one area of the second surface of the flexible panel corresponding to an inner surface of the bent flexible panel and one edge of the first protection film and one edge the second protection film that are adjacent each other.

11. The flexible display apparatus of claim 7, wherein the first area comprises a display area for displaying an image, and
wherein the second area comprises a pad area where a pad terminal is arranged.

12. A flexible display apparatus comprising:
a flexible panel having a first area, a bending area extending from the first area, and a second area extending from the bending area;
a first protection film and a second protection film on a surface of the flexible panel, a gap between the first protection film and the second protection film being at the bending area of the flexible panel;
a filler in the gap at the bending area and extending between the first protection film and the second protection film; and a cover film on the filler, wherein the flexible panel has a first surface and a second surface opposite to the first surface, wherein the first protection film and the second protection film are on the first surface of the flexible panel, wherein the bending area is bent from the first surface toward the second surface, wherein the first surface is an outer surface of the bent flexible panel, wherein the filler is on the first surface of the bent flexible panel, wherein the filler directly contacts the first protection film, the second protection film, the flexible panel, and the cover film, and wherein the first area comprises a first display area for displaying an image, the second area comprises a second display area for displaying an image, and the bending area comprises a display area for displaying an image.

13. The flexible display apparatus of claim 12, wherein the cover film covers at least a portion of the first protection film, at least a portion of the second protection film, and the filler between the first protection film and the second protection film.

14. The flexible display apparatus of claim 12, wherein the flexible panel is an out-foldable panel.

15. The flexible display apparatus of claim 12, further comprising a reinforcement film on the second surface of the flexible panel, wherein the second surface is an inner surface of the flexible panel.

16. The flexible display apparatus of claim 1, wherein the filler comprises an optically clear resin.

17. A flexible display apparatus comprising: a flexible panel having a first area comprising display area for displaying an image, a bending area extending from the first area, and a second area extending from the bending area; a plurality of separate protection films on a surface of the flexible panel, the separate protection films having a gap there between at the bending area of the flexible panel; and a filler in the gap at the bending area and extending between the plurality of separate protection films, wherein each of the plurality of separate protection films has a side surface crossing the surface of the flexible panel, wherein adjacent side surfaces of the plurality of separate protection films contact each other to define the gap with the surface of the flexible panel at the bending area, and wherein the filler directly contacts the adjacent side surfaces of the plurality of separate protection films and the surface of the flexible panel, wherein the first area comprises a first display area for displaying an image, the second area comprises a second display area for displaying an image, and the bending area comprises a display area for displaying an image.

* * * * *